United States Patent
Tsai et al.

(10) Patent No.: US 7,465,676 B2
(45) Date of Patent: Dec. 16, 2008

(54) METHOD FOR FORMING DIELECTRIC FILM TO IMPROVE ADHESION OF LOW-K FILM

(75) Inventors: Fang Wen Tsai, Hsinchu (TW); I-I Chen, Hsinchu (TW); Zhen-Cheng Wu, Hsinchu (TW); Chih-Lung Lin, Taipei (TW); Tien-I Bao, Hsin-Chu (TW); Shwang-Ming Jeng, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 166 days.

(21) Appl. No.: 11/409,658

(22) Filed: Apr. 24, 2006

(65) Prior Publication Data

US 2007/0249159 A1    Oct. 25, 2007

(51) Int. Cl.
*H01L 21/31* (2006.01)
*H01L 21/469* (2006.01)

(52) U.S. Cl. .................. 438/761; 438/637; 438/778; 257/E21.159; 257/E21.16; 257/E21.477; 257/774; 257/760

(58) Field of Classification Search .......... 438/637, 438/644, 761, 778, 781, 782, 789, 792, 794; 257/E21.159, E21.16, E21.477, E21.478, 257/E21.187; 427/97.6, 97.4, 255.23, 255.28
See application file for complete search history.

(56) References Cited

U.S. PATENT DOCUMENTS

| | | | |
|---|---|---|---|
| 6,797,605 B2 | 9/2004 | Goh et al. | |
| 6,812,043 B2 | 11/2004 | Bao et al. | |
| 6,818,557 B1 | 11/2004 | Ngo et al. | |
| 6,846,756 B2 | 1/2005 | Pan et al. | |
| 6,878,615 B2 | 4/2005 | Tsai et al. | |
| 6,878,628 B2 | 4/2005 | Sophie et al. | |
| 2006/0166491 A1* | 7/2006 | Ida | 438/637 |
| 2006/0183348 A1* | 8/2006 | Meagley et al. | 438/789 |

OTHER PUBLICATIONS

Yoon, S.W., et al., "Flipchip Bump Integrity with Copper/Ultra Low-k Dielectrics for Fine Pitch Flipchip Packaging," 2004 Electronic Components and Technology Conference, IEEE, pp. 1636-1641.

Scherban, T., et al., "Interfacial Adhesion of Copper-Low k Interconnects," IEEE, Interconnect Technology Conference, Jun. 4-6, 2001, pp. 257-259.

* cited by examiner

*Primary Examiner*—Caridad M Everhart
(74) *Attorney, Agent, or Firm*—Slater & Matsil, L.L.P.

(57) ABSTRACT

A semiconductor structure having improved adhesion between a low-k dielectric layer and the underlying layer and a method for forming the same are provided. The semiconductor substrate includes a dielectric layer over a semiconductor substrate, an adhesion layer on the dielectric layer wherein the adhesion layer comprises a transition sub-layer over an initial sub-layer, and wherein the transition sub-layer has a composition that gradually changes from a lower portion to an upper portion. A low-k dielectric layer is formed on the adhesion layer. Damascene openings are formed in the low-k dielectric layer. A top portion of the transition sub-layer has a composition substantially similar to a composition of the low-k dielectric layer. A bottom portion of the transition sub-layer has a composition substantially similar to a composition of the initial sub-layer.

23 Claims, 3 Drawing Sheets

METHOD FOR FORMING DIELECTRIC FILM TO IMPROVE ADHESION OF LOW-K FILM

TECHNICAL FIELD

This invention relates generally to integrated circuit fabrication processes, and more particularly to improving adhesion of low-k dielectric layers.

BACKGROUND

As the semiconductor industry introduces new generations of integrated circuits (IC's) having higher performance and greater functionality, the density of the elements that form the integrated circuits is increased, and the dimensions, sizes and spacing between the individual components or elements are reduced. While in the past such reductions were limited only by the ability to define the structures photo-lithographically, device geometries having even smaller dimensions created new limiting factors. For example, for any two adjacent conductive paths, as the distance between the conductors decreases, the resulting capacitance (a function of the dielectric constant (k) of the insulating material divided by the distance between conductive paths) increases. This increased capacitance results in increased capacitive coupling between the conductors, increased power consumption, and an increase in the resistive-capacitive (RC) time constant. Therefore, continual improvement in semiconductor IC performance and functionality is dependent upon developing materials that form a dielectric film with a lower dielectric constant (k) than that of the most commonly used material, silicon oxide, in order to reduce capacitance. As the dimensions of these devices get smaller and smaller, significant reduction in capacitance into the so-called "ultra low-k" regime is required.

New materials with low dielectric constants (known in the art as "low-k dielectrics") are being investigated for use as insulators in semiconductor chip designs. A low dielectric constant material aids in enabling further reduction in the integrated circuit feature dimensions. In conventional IC processing, $SiO_2$ is used as a basis for the dielectric material, resulting in a dielectric constant of about 3.9. Moreover, advanced low-k dielectric materials have dielectric constants below about 2.7. The substance with the lowest dielectric constant is air (k=1.0). Therefore, porous dielectrics are very promising candidates since they have the potential to provide very low dielectric constants.

However, porous films are mechanically weak by nature. Weak films fail during the chemical mechanical polish (CMP) process employed to planarize the wafer surface during chip manufacturing. The mechanical properties of a porous film are functions of the porosity of the film. Naturally, higher porosity results in a lower dielectric constant but also poorer mechanical properties. Typically, cracking and/or peeling often occur during subsequent processing and/or packaging steps.

As is known in the art, one of the causes of cracking and peeling is poor adhesion between the low-k dielectric layers and underlying/overlying layers. Due to the poor adhesion problem, the usage of low-k dielectrics is limited, and thus a method that maximizes the benefit of low-k dielectrics while reducing the effects of weak mechanical properties is needed.

SUMMARY OF THE INVENTION

The preferred embodiment of the present invention provides a semiconductor structure having improved adhesion between a low-k dielectric layer and the underlying layer and a method for forming the same.

In accordance with one aspect of the present invention, the semiconductor structure includes a dielectric layer over a semiconductor substrate, an adhesion layer on the dielectric layer wherein the adhesion layer comprises a transition layer, and wherein the transition layer has a composition that gradually changes from a lower portion to an upper portion. A low-k dielectric layer is formed on the adhesion layer. Damascene openings are formed in the low-k dielectric layer. Preferably, a top portion of the transition layer has a composition substantially similar to a composition of the low-k dielectric layer.

In accordance with another aspect of the present invention, a method for forming the preferred embodiments of the present invention includes providing a semiconductor substrate, forming a dielectric layer over the semiconductor substrate, forming an adhesion layer on the dielectric layer using a chemical vapor deposition method, wherein the adhesion layer comprises a transition layer over an initial layer. During the process of forming the transition layer, process conditions are changed from substantially similar to process conditions for forming the initial layer to substantially similar to process conditions for forming a low-k dielectric layer. The method further includes forming the low-k dielectric layer on the adhesion layer in-situ with the adhesion layer, and forming damascene openings in the low-k dielectric layer.

By smoothly transitioning the process conditions for forming the transition layer, a clear interface between the low-k dielectric layer and the underlying layer is eliminated, and adhesion is improved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel structure for forming a low-k dielectric layer is provided. The intermediate stages for manufacturing the preferred embodiment of the present invention are illustrated. Variations of the preferred embodiments are then discussed. Throughout the various views and illustrative embodiments of the present invention, like reference numbers are used to designate like elements.

Figure 1:
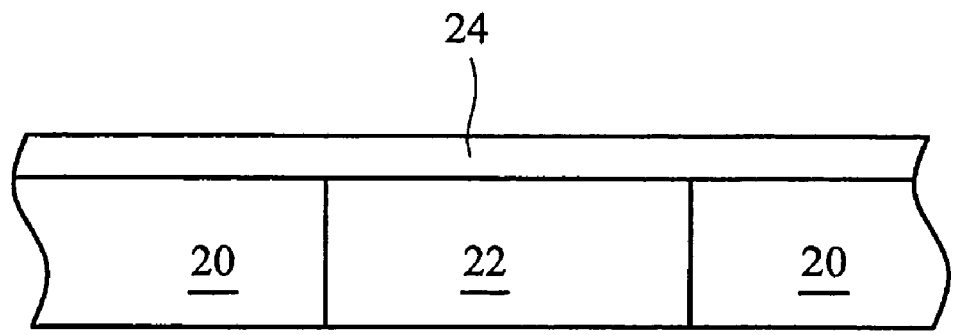
FIGS. 1 through 6 are cross-sectional views of intermediate stages in the manufacture of a preferred embodiment.

FIG. 1 illustrates a starting structure having a conductive line 22 formed in a dielectric layer 20 over a semiconductor substrate (not shown), which is preferably a silicon substrate having semiconductor devices formed thereon. Conductive line 22 is preferably a metal comprising copper, tungsten, aluminum, silver, gold, alloys thereof, compounds thereof, and combinations thereof. It can also be formed of other conductive materials such as doped polysilicon. Conductive line 22 is typically connected to another feature (not shown), such as a via or a contact plug. Dielectric layer 20 may be an inter-layer dielectric (ILD) layer or an inter-metal dielectric (IMD) layer.

An etch stop layer (ESL) 24 is formed on dielectric layer 20 and conductive line 22. Preferably, ESL 24 comprises nitrides such as silicon nitride, silicon-carbon based materials such as silicon carbide (SiC) and carbon-doped silicon oxide, carbon-doped oxide, and combinations thereof. The preferred formation method is plasma enhanced chemical vapor deposition (PECVD). However, other commonly used methods such as high-density plasma CVD (HDPCVD), atomic layer CVD (ALCVD), and the like can also be used. In an exemplary embodiment wherein ESL 24 comprises silicon nitride or silicon carbide, the formation is preferably performed in a chamber in which gaseous precursors such as silane ($SiH_4$) and ammonia ($NH_3$) are introduced and a chemical reaction occurs. The thickness of ESL 24 is preferably less than about 1000 Å.

In alternative embodiments, layer 24 is a diffusion barrier layer preventing undesirable elements, such as copper, from diffusing into the subsequently formed low-k dielectric layer. In a more preferred embodiment, layer 24 acts as both an etch stop layer and a diffusion barrier layer.

Figure 2:
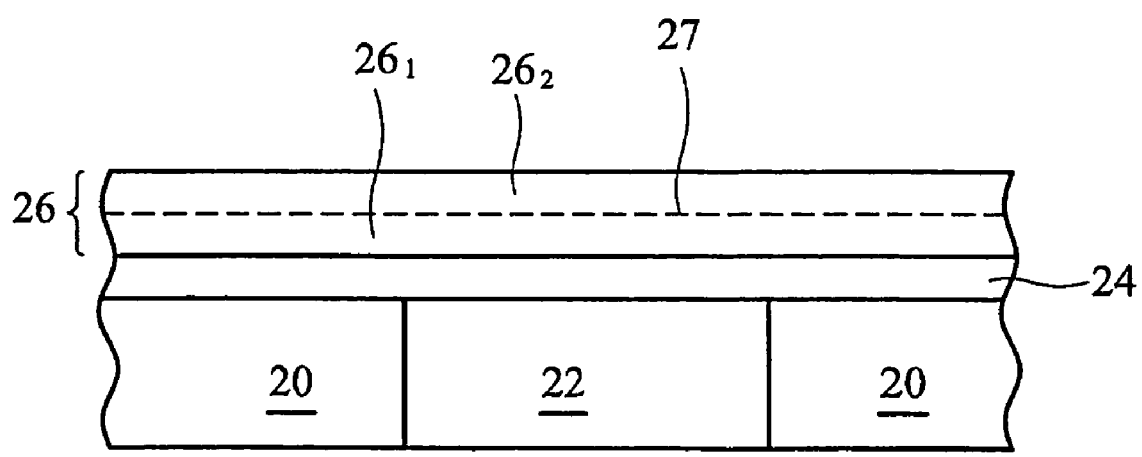

FIG. 2 illustrates the formation of an adhesion layer 26. In the preferred embodiment, adhesion layer 26 comprises an initial sub-layer $26_1$ and a transition sub-layer $26_2$. The preferred formation methods include a CVD method such as PECVD, HDPCVD, ALCVD, and the like. ESL 24 and adhesion layer 26 can be formed using the same or different methods. However, adhesion layer 26 is preferably formed in a different chamber from ESL 24, although the same chamber can be used.

Initial sub-layer $26_1$ is preferably used as a base for forming a good contact between the adhesion layer 26 and the underlying ESL 24. Initial sub-layer $26_1$ preferably comprises carbon, and more preferably comprises a carbon-doped oxide such as carbon-doped silicon oxide. Initial sub-layer $26_1$ preferably has a dielectric constant (k value) of greater than about 2.7, and a density of greater than the subsequently formed low-k dielectric layer.

An exemplary embodiment for forming initial sub-layer $26_1$ is shown below, wherein silicon oxycarbide is formed using PECVD in an Applied Materials' (AMAT) PECVD Producer SE. The exemplary process conditions include a RF power of about 100 W to about 500 W, an oxygen flow rate of about 50 to about 1000 sccm, an inorganic precursor flow rate of about 100 mgm~3000 mgm, wherein the inorganic precursor includes Si, O, C, and H, a chamber pressure of about 3 torrs to about 9 torrs, and a temperature of about 150° C. to about 400° C.

Preferably, the initial sub-layer $26_1$ has a thickness of between about 10 Å and about 200 Å, and more preferably between about 30 Å and about 100 Å. Carbon and hydrogen concentrations in initial sub-layer $26_1$ are preferably less than about 20 percent.

Transition sub-layer $26_2$ preferably comprises carbon, and more preferably comprises a carbon-doped oxide such as carbon-doped silicon oxide. Also, transition sub-layer $26_2$ preferably has a dielectric constant (k value) of greater than about 2.3, and a density of greater than the subsequently formed low-k dielectric layer. Preferably, a thickness of transition sub-layer $26_2$ is between about 50 Å and about 300 Å, and more preferably between about 100 Å and about 250 Å.

Adhesion layer 26, on the other hand, preferably has a combined thickness of between about 50 Å and about 500 Å, and more preferably between about 100 Å and about 300 Å. Although FIG. 2 illustrates an interface 27 between initial sub-layer $26_1$ and transition sub-layer $26_2$ for illustration purposes, in practical cases, there is no clear interface since the formation of the transition sub-layer $26_2$ is gradually transitioned from the formation of initial sub-layer $26_1$. The interface, however, is still identifiable by using tools such as transmission electron microscopy (TEM).

Although in the preferred embodiment, an initial sub-layer $26_1$ is formed, it is to be appreciated that the formation of the initial sub-layer $26_1$ is for process convenience. In alternative embodiments, the formation of the initial sub-layer $26_1$ is skipped, and the process conditions immediately start transitioning when the formation of the adhesion layer 26 starts.

The process conditions for the transition sub-layer $26_2$ are preferably determined by the process conditions of the initial sub-layer and the subsequently formed low-k dielectric layer. In the preferred embodiment, through a smooth transition, the process conditions are changed from the process conditions for forming initial layer $26_1$ to the formation conditions for forming the overlying low-k dielectric layer. In alternative embodiments, at least one process condition gradually changes at a time, and during the process step of forming the transition layer $26_2$, substantially all process conditions are transitioned. For example, assuming the formation of initial sub-layer $26_1$ requires a precursor A at a flow rate of $F_A$, and the formation of a subsequently formed low-k dielectric layer requires a precursor B at a flow rate of $F_B$, if A and B are the same precursor, during the formation of transition layer $26_2$, the flow rate of precursor A/B is gradually adjusted from $F_A$ to $F_B$. If A and B are different precursors, the flow rate of A is gradually reduced to zero and the flow rate of B is gradually increased from zero to $F_B$, and the reduction of the flow rate of A and the increment of the flow rate of B may be performed sequentially or simultaneously.

Due to the gradually changing process conditions, at least one of the characteristics gradually changes from lower portions of the transition layer $26_2$ to upper portions. The gradually changed characteristics preferably include, but are not limited to, carbon concentration, oxygen concentration, silicon concentration, and combinations thereof.

In the preferred embodiment, the process conditions are changed continuously during the formation of transition layer $26_2$. In other embodiments, the process conditions are changed in several stages. From stage to stage, one or more process conditions are adjusted. The final result is that after the final stage, the process conditions are substantially similar to those for forming the overlying low-k dielectric layer. Preferably, during the formation of transition sub-layer $26_2$, the CVD plasma is turned on. Alternatively, the CVD plasma is turned off.

In an exemplary process for forming initial sub-layer $26_1$, three sets of intermediate process conditions (stages) include a RF power of about 200 W, 300 W, and 400 W, respectively, an oxygen flow rate of about 100 sccm, 200 sccm, and 300 sccm, respectively, an inorganic precursor flow rate of about 300 mgm, 400 mgm, and 500 mgm, respectively, wherein the inorganic precursor includes Si, O, C, H, a chamber pressure of about 5 torrs, 7 torrs, and 9 torrs, respectively, and a temperature of about 250° C., 300° C., and 350° C., respectively.

Figure 3:
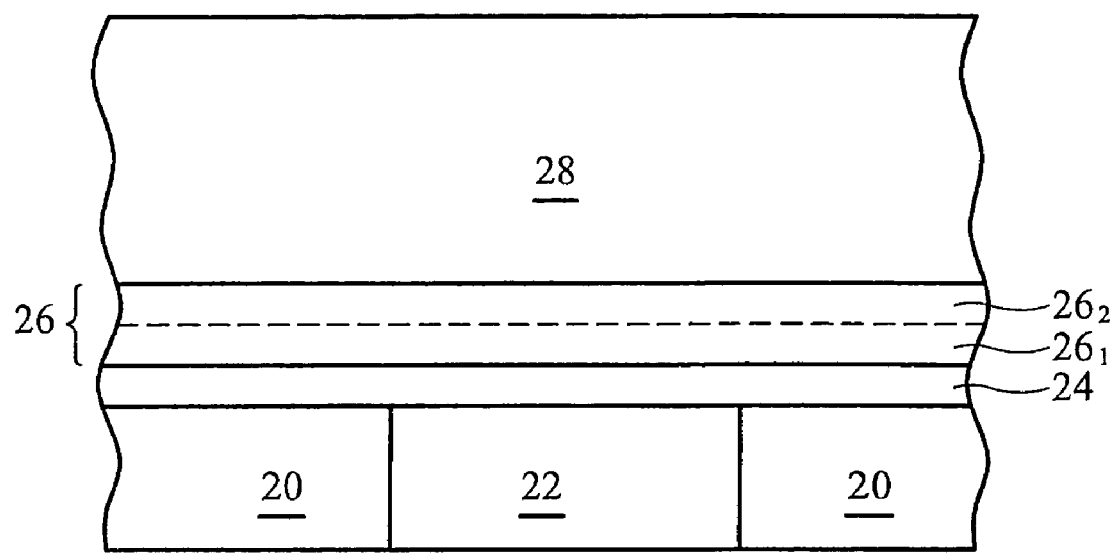

At the end of the formation of transition sub-layer $26_2$, the process conditions have substantially transitioned to the process conditions for forming a low-k dielectric layer, and a low-k dielectric layer 28 is deposited, as shown in FIG. 3. The low-k dielectric layer 28 provides insulation between the conductive line 22 and the overlying conductive lines that will be formed subsequently, hence is sometimes referred to as an inter-metal dielectric (IMD) layer. Low-k dielectric layer 28 is preferably deposited using a CVD method, such as PECVD and ALCVD, and is preferably deposited in a same chamber for forming adhesion layer 26.

Since the process conditions for forming transition sub-layer $26_2$ are gradually changed, the composition of the transition sub-layer $26_2$ gradually changes from the lower portion to the upper portion. The composition of the bottom portion of the transition sub-layer $26_2$ is substantially similar to that of the initial layer $26_1$, and the composition of the top portion of the transition sub-layer $26_2$ is substantially similar to that of the low-k dielectric layer 28. In an exemplary embodiment, low-k dielectric layer 28 has a higher carbon concentration than the transition sub-layer $26_2$. Accordingly, the carbon concentration continuously increases from the lower portion to the upper portion of the sub-layer $26_2$.

The top portion of the transition sub-layer $26_2$ preferably has at least one, and more preferably all, of its characteristics substantially similar to that of the low-k dielectric layer 28. In the preferred embodiment, the dielectric constant of the transition sub-layer $26_2$ is close to but greater than the dielectric constant of the low-k dielectric layer 28.

Since there is no clear interface between the low-k dielectric layer 28 and its underlying layer, there is no abrupt change of characteristics, for example, the thermal expansion coefficients of low-k dielectric layer 28 and the underlying layer. It is less likely that cracking and/or peeling will occur due to thermal or mechanical stresses. The adhesion between low-k dielectric layer 28 and the underlying layer is thus significantly improved.

The low-k dielectric layer 28 preferably has a dielectric constant (k value) of lower than about 2.7, and more preferably lower than about 2.3, and a porosity of between about 15 percent and about 50 percent, and more preferably between about 25 percent and about 50 percent. The thickness is preferably between about 2000 Å and about 6000 Å. Preferably, the carbon concentration is higher than 20 percent.

Figure 4:
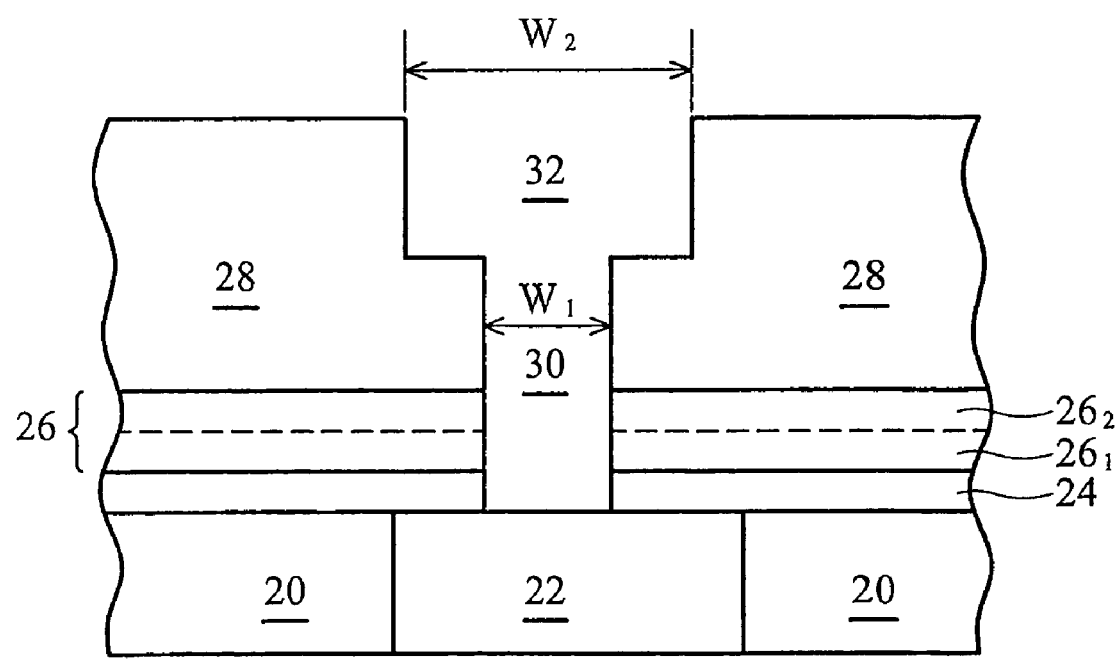

FIG. 4 illustrates the formation of a via opening 30 and a trench opening 32 in low-k dielectric layer 28. Photo resists (not shown) are formed and patterned over low-k dielectric layer 28. In the preferred embodiment, an anisotropic etch cuts through the low-k dielectric layer 28 and stops at the ESL 24, thereby forming a via opening 30. Trench opening 32 is then formed and used to form upper-level conductive lines. Since there is no etch stop layer for forming trench opening 32, etching time is controlled so that the etching of the trench opening 32 stops at a desired depth. In alternative embodiments, a trench-first approach is taken, in which the trench opening 32 is formed prior to the formation of the via opening 30. In an exemplary embodiment, via opening 30 has a width $W_1$ of between about 30 nm and about 65 nm, and trench opening 32 has a width $W_2$ of between about 40 nm and about 130 nm. ESL 24 is then etched through via opening 30, exposing underlying conductive line 22.

Figure 5:
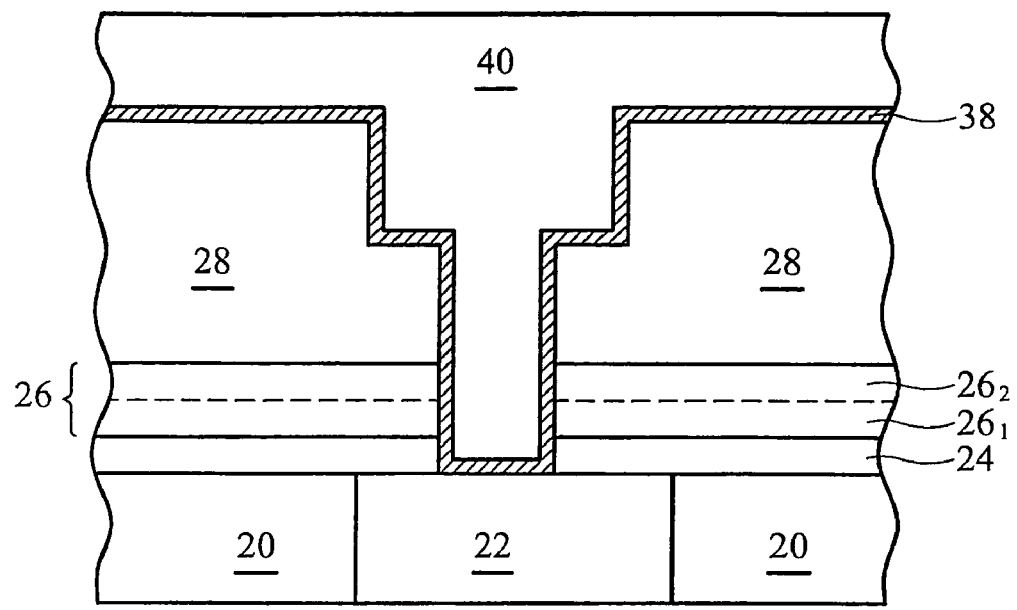
Figure 6:
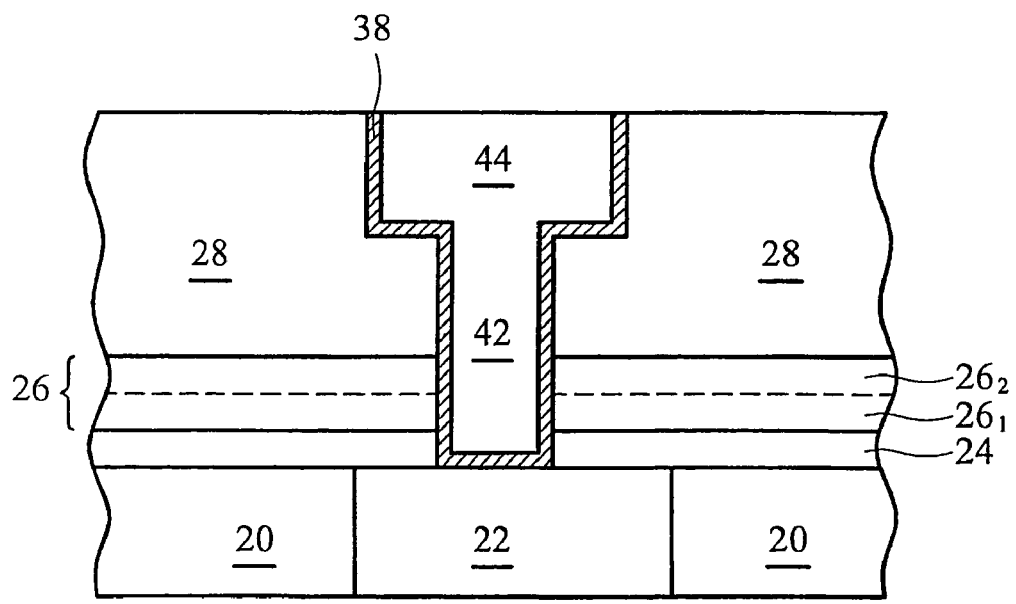

FIG. 5 illustrates the formation of a barrier layer 38 and the filling of via opening 30 and trench opening 32. Barrier layer 38 prevents copper from diffusing into low-k dielectric layer 28 and is preferably formed of a material comprising titanium, titanium nitride, tantalum, tantalum nitride, and the like. It may have a single layer or a composite structure. Via opening 30 and trench opening 32 are filled with a conductive material 40, preferably copper or copper alloys. However, other metals and metal alloys such as aluminum, silver and gold can also be used. A chemical mechanical polish is then performed to level the surface, forming via 42 and metal line 44. The resulting structure is shown in FIG. 6.

By depositing a transition layer, the adhesion between the low-k dielectric layer and the underlying layer is improved. Cracking and peeling problems are thus reduced. The fabrication processes of the preferred embodiment are fully compatible with the existing integration circuit fabrication processes.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor structure, the method comprising:
   providing a semiconductor substrate;
   forming a dielectric layer over the semiconductor substrate;
   forming an etch stop layer over the dielectric layer;
   forming an adhesion layer over and adjacent the etch stop layer using a chemical vapor deposition (CVD) method, wherein the adhesion layer comprises a transition sub-layer over the dielectric layer, and wherein the transition sub-layer has at least one characteristic that gradually changes from a lower portion to an upper portion of the transition sub-layer;
   forming a low-k dielectric layer on the adhesion layer in-situ with the adhesion layer; and
   forming damascene openings in the low-k dielectric layer.

2. The method of claim 1, wherein the at least one characteristic comprises carbon concentration, oxygen concentration, silicon concentration, and combinations thereof.

3. The method of claim 1, wherein the dielectric layer is formed in a first chamber, and wherein the adhesion layer and the low-k dielectric layer are formed in a second chamber.

4. The method of claim 1, wherein the adhesion layer and the low-k dielectric layer are formed using plasma enhanced chemical vapor deposition (PECVD).

5. The method of claim 1 further comprising forming an initial sub-layer before the step of forming the transition sub-layer, wherein process conditions for forming the initial sub-layer are gradually adjusted to be the same as process conditions for forming a bottom portion of the transition sub-layer, and wherein process conditions for forming a top portion of the transition sub-layer are substantially the same as process conditions for forming the low-k dielectric layer.

6. The method of claim 1, wherein plasma is turned on during the step of forming the transition sub-layer.

7. The method of claim 1, wherein the adhesion layer is in physical contact with the etch stop layer.

8. The method of claim 1, wherein a thickness of the adhesion layer is between about 50 Å and about 500 Å.

9. The method of claim 8, wherein the thickness of the adhesion layer is between about 100 Å and about 300 Å.

10. A method for forming a semiconductor structure, the method comprising:
providing a semiconductor substrate;
forming an etch stop layer over the semiconductor substrate;
forming an initial layer over and adjacent the etch stop layer in a chamber using a CVD method;
gradually changing process conditions of the initial layer to form a transition layer on the initial layer in the chamber, wherein the transition layer is adjacent the etch stop layer;
in-situ forming a low-k dielectric layer on the transition layer in the chamber, wherein during the process of forming the transition layer, process conditions are changed so that process conditions for forming a top portion of the transition layer substantially match process conditions for forming the low-k dielectric layer; and
forming damascene openings in the low-k dielectric layer.

11. The method of claim 10, wherein the etch stop layer is formed in an additional chamber.

12. The method of claim 10, wherein the transition layer is in physical contact with the etch stop layer.

13. A semiconductor structure comprising:
a semiconductor substrate;
a dielectric layer over the semiconductor substrate;
an etch stop layer over and adjacent the dielectric layer;
an adhesion layer over and adjacent the etch stop layer, wherein the adhesion layer comprises a transition sub-layer, and wherein the transition sub-layer has a composition that gradually changes from a lower portion to an upper portion;
a low-k dielectric layer on the adhesion layer; and
damascene openings in the low-k dielectric layer.

14. The semiconductor structure of claim 13, wherein a top portion of the transition sub-layer has a composition substantially similar to a composition of the low-k dielectric layer.

15. The semiconductor structure of claim 13, wherein the composition of the top portion of the transition sub-layer and the composition in the low-k dielectric layer has a first difference, and the composition of a bottom portion of the transition sub-layer and the composition in the low-k dielectric layer has a second difference, and wherein the first difference is less than about 10 percent of the second difference.

16. The semiconductor structure of claim 13 further comprising an initial layer underlying the transition sub-layer.

17. The semiconductor structure of claim 13, wherein a dielectric constant of the transition sub-layer is greater than about 2.3.

18. The semiconductor structure of claim 13, wherein the low-k dielectric layer has a high carbon concentration, and wherein the transition layer has a carbon concentration gradually increasing from a lower portion to an upper portion.

19. The semiconductor structure of claim 13, wherein the adhesion layer comprises a carbon-doped material.

20. The semiconductor structure of claim 13, wherein the low-k dielectric layer comprises a carbon-doped oxide.

21. The semiconductor structure of claim 13, wherein the adhesion layer is in physical contact with the etch stop layer.

22. The semiconductor structure of claim 13, wherein a thickness of the adhesion layer is between about 50 Å and about 500 Å.

23. The semiconductor structure of claim 22, wherein the thickness of the adhesion layer is between about 100 Å and about 300 Å.

* * * * *